United States Patent [19]

Steigerwald

[11] Patent Number: 5,302,862
[45] Date of Patent: Apr. 12, 1994

[54] EFFICIENT TRANSFORMER-COUPLED GATE DRIVER CIRCUIT FOR POWER FET'S

[75] Inventor: Robert L. Steigerwald, Burnt Hills, N.Y.

[73] Assignee: General Electric Company, Schenectady, N.Y.

[21] Appl. No.: 996,202

[22] Filed: Dec. 23, 1992

[51] Int. Cl.⁵ .................... H03K 17/687; H03K 3/30
[52] U.S. Cl. .................................. 307/282; 307/571; 307/268
[58] Field of Search ............... 307/282, 571, 268, 253, 307/254

[56] References Cited

U.S. PATENT DOCUMENTS 4,461,966 7/1984 Hebenstreit ..................... 307/282

FOREIGN PATENT DOCUMENTS 3230080 2/1984 Fed. Rep. of Germany ...... 307/246

*Primary Examiner*—Margaret R. Wambach
*Attorney, Agent, or Firm*—Geoffrey H. Krauss; Jill M. Breedlove

[57] ABSTRACT

A gate driver circuit for a converter which requires an approximately 50% duty cycle to drive two power switching devices (e.g., in many interleaved, push-pull and bridge converters) includes a single transformer secondary winding coupled between the gates of the two devices. The transformer is reset every half-cycle by driving each device in the forward, or positive, direction only. Advantageously, the result is an approximately 50% reduction in gate drive power as compared with conventional schemes requiring a negative gate drive voltage for turn-off.

7 Claims, 3 Drawing Sheets 5,302,862

EFFICIENT TRANSFORMER-COUPLED GATE DRIVER CIRCUIT FOR POWER FET'S

FIELD OF THE INVENTION

The present invention relates generally to power converters and, more particularly, to driver circuits for converters requiring an approximately 50% duty cycle drive for switching devices employed therein.

BACKGROUND OF THE INVENTION

In many power converters employing field effect transistors (FET's), the power FET gate drive circuits need to be electrically isolated from the control circuitry. According to one scheme, an ac voltage is directly coupled through a pulse transformer such that the FET gates are driven with voltages of both polarities. That is, the device is turned on with a positive voltage (e.g., +10 volts) and turned off with a negative voltage (e.g., −10 volts). Hence, a shortcoming of this scheme is that energy is needed to drive the gates in the negative direction as well as the positive direction. As a result, twice the gate drive power is needed as compared with a non-isolated gate driver which drives the gate voltage positive to turn it on and reduces it to zero voltage to turn it off.

Accordingly, it is desirable to provide a gate driver circuit for power FET's which efficiently transformer-couples the gate driver circuit thereto without the need to charge each gate to a negative voltage in order to turn it off and also to reset the flux in the gate drive transformer.

SUMMARY OF THE INVENTION

A gate driver circuit for a converter which requires an approximately 50% duty cycle to drive two power switching devices (e.g., in many interleaved, push-pull and bridge converters) comprises a single transformer secondary winding coupled between the gates of the two devices. The transformer is reset every half-cycle by driving each device in the forward, or positive, direction only. Advantageously, the result is an approximately 50% reduction in gate drive power as compared with conventional schemes requiring a negative gate drive voltage for turn-off.

In another aspect of the present invention, where only a single device needs to be driven, a storage, or reset, capacitor is used to emulate a second device (i.e., the gate capacitance thereof) to minimize losses in the device.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
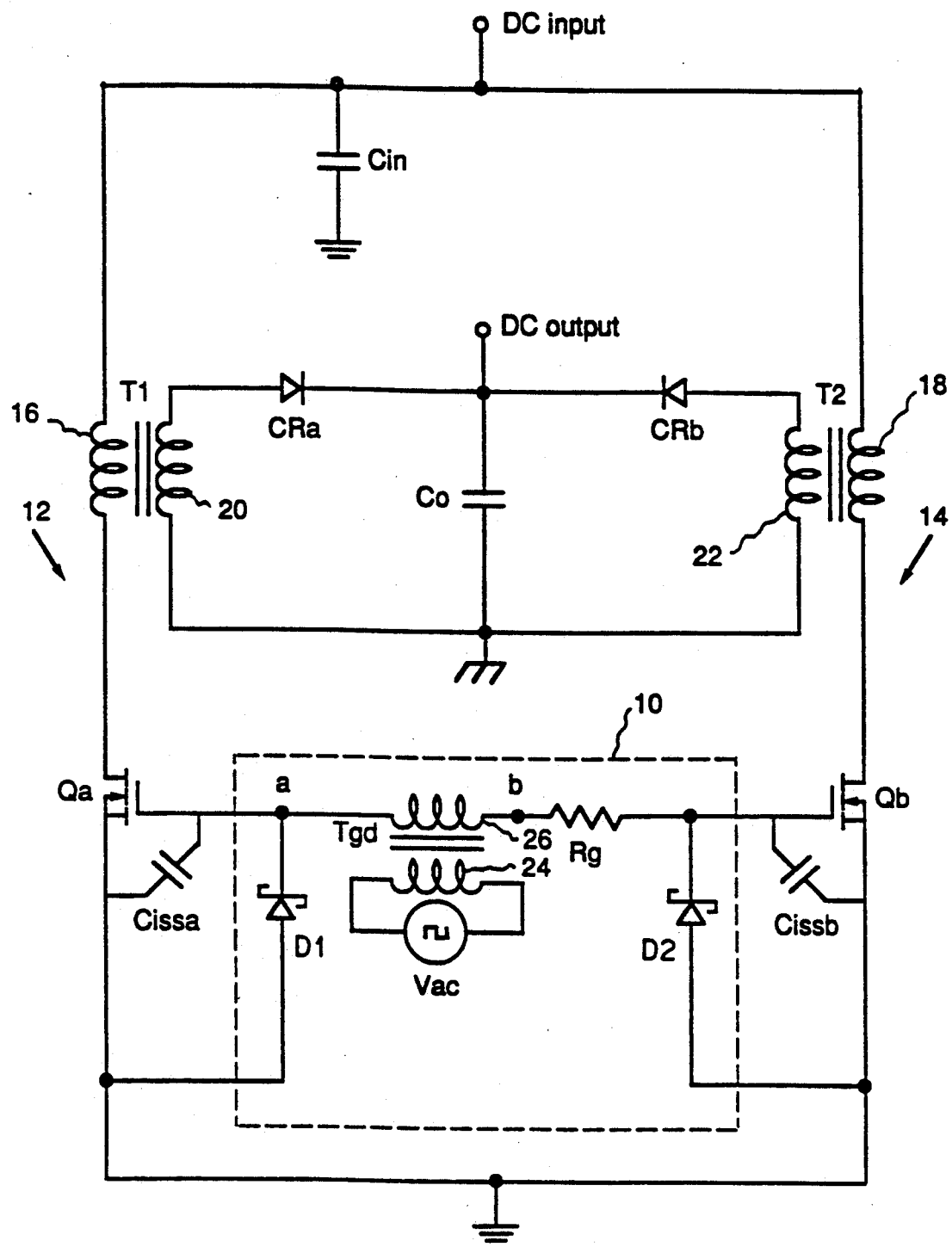
FIG. 1 schematically illustrates a gate driver circuit according to one embodiment of the present invention.

FIG. 1 illustrates a gate driver circuit 10 according to the present invention for driving power FET's Qa and Qb of converters 12 and 14. By way of example, converters 12 and 14 are illustrated as comprising forward converters operated in an interleaved manner. That is, they are operating 360°/N out-of-phase, where N is the number of converters (N=2 for the case of FIG. 1). However, the principles of the present invention apply to any circuit that requires an approximately 50% duty cycle drive for switching devices employed therein. Moreover, although the circuit of FIG. 1 illustrates (FET's, the invention applies to drives for other types of suitable devices, such as most MOS-gated devices (e.g., MOSFET's, IGBT's and MCT's) and bipolar transistors.

In the interleaved forward converters of FIG. 1, the sources of devices Qa and Qb are each coupled to a common potential, and the drains of devices Qa and Qb are each coupled to one terminal of a primary winding 16 and 18, respectively, of a transformer T1 and T2, respectively. The other terminal of each of the primary windings of transformers T1 and T2 is coupled to a dc input, across which there is shown a filter capacitor Cin. The secondary winding 20 and 22 of each of transformers T1 and T2, respectively, is coupled via a diode CRa and CRb, respectively, to a dc output, which is taken across an output filter capacitor Co.

Gate driver circuit 10 comprises a gate drive transformer Tgd having a primary winding 24 coupled across an ac input and a secondary winding 26 coupled between the gates of devices Qa and Qb. A resistor Rg is coupled in series with secondary winding 26. A Schottky diode D1 and D2, respectively, is coupled between the source and gate of each of devices Qa and Qb, respectively, to prevent the off-going FET gate from ringing negative due to parasitic inductances.

In operation, devices Qa and Qb are each driven at an approximately 50% duty cycle and 180° out-of-phase. Primary winding 24 of transformer Tgd is driven with a square wave voltage Vac. Depending on the polarity of the square wave voltage drive, either device Qa or Qb is turned on. For example, assuming that the terminal b of secondary winding 26 of transformer Tgd is at a positive voltage, then device Qb is on and device Qa is off. When the transformer gate drive reverses polarity, the gate capacitance Cissb of device Qb begins to discharge, and the gate capacitance Cissa of device Qa begins to charge. Ideally, all of the charge on capacitance Cissb is transferred to capacitance Cissa, and the gate voltage of device Qa charges to the initial gate voltage on device Qb as capacitance Cissb discharges to zero. The gate drive power $P_{gate}$ delivered by gate drive transformer Tgd to each device is given by:

$$P_{gate} = C_{iss} V_{gs}^2 f,$$

where $V_{gs}$ is the positive gate voltage, and f is the frequency of operation. Advantageously, the device being turned off (i.e., the off-going device) rings down to zero rather than becoming negative as in conventional gate drivers, as described hereinabove. For purposes of comparison, if the gate were allowed to go negative, as in conventional gate drivers, the gate drive loss per device would be given by:

$P_{gate} = 2 C_{iss} V_{gs}^2 f.$

Hence, the conventional scheme has twice the loss per device as the gate driver according to the present invention.

In FIG. 1, damping resistor Rg is included as a practical matter to suppress the ringing between gate capacitances Cissa and Cissb and the transformer leakage inductances. Without suppression of this ringing, it has been found that the off-going device will not ring all the way to zero and, therefore, will not turn off properly. Also, the Schottky diodes insure that the gates of devices Qa and Qb do not go negative due to this ringing.

Figure 2:
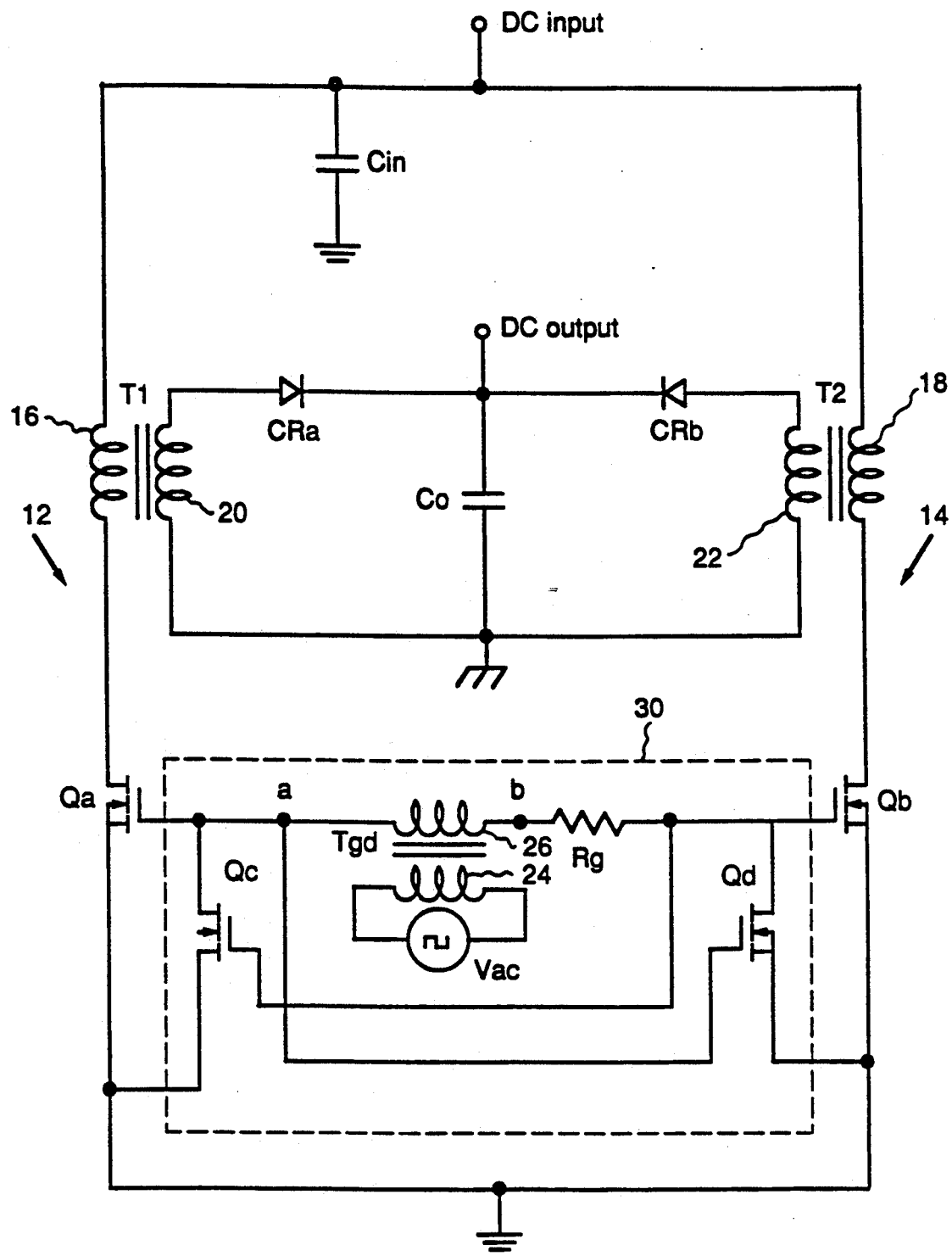
FIG. 2 schematically illustrates a gate driver circuit according to another embodiment of the present invention.

FIG. 2 illustrates an alternative embodiment of a gate driver circuit 30 according to the present invention which avoids the effect of gate drive transformer leakage inductance ringing with gate capacitance. In the embodiment of FIG. 2, two small auxiliary devices Qc and Qd are cross-coupled to the gates of devices Qa and Qb. Auxiliary devices Qc and Qd serve to actively drive the off-going FET's gate voltage to zero even when gate drive transformer Tgd has substantial leakage inductance. Hence, the gate drive transformer Tgd can be built with high interwinding insulation, if desired.

The circuit of FIG. 2 operates as follows. Assuming that terminal b of secondary winding 26 of gate drive transformer Tgd is at a positive voltage, then device Qb is on and device Qa is off. When the transformer gate drive reverses polarity, the gate capacitance Cissb of device Qb begins to discharge, and the gate capacitance Cissa of device Qa begins to charge. As the gate voltage of device Qb approaches zero, device Qc is turned off, causing the gate of device Qa to charge to a positive polarity. As a result, device Qd turns on, causing Qb to turn off. That is, the gate of device Qb is actively held to near zero voltage by device Qd. In this manner, the off-going device is switched off completely, regardless of the gate-drive transformer leakage inductance and damping resistance Rg.

In many voltage-fed circuits, such as that of FIG. 2, the gate turn-on threshold voltages of auxiliary devices Qc and Qd can be adjusted relative to the threshold voltages of the main switching devices Qa and Qb in order to control "dead time", i.e., the time during which both devices are off. In particular, if the threshold voltage of auxiliary devices Qc and Qd is less than that of devices Qa and Qb, then there is a controlled dead time during which both devices are off. The amount of dead time depends on the difference in the threshold voltages; the greater the difference in thresholds, the longer the dead time.

Conversely, in many current-fed push-pull circuits, if the threshold voltage of the auxiliary devices is adjusted to be greater than that of the main switching devices, then there is a controlled conduction overlap of the main switching devices which depends on the difference in the threshold voltages.

Figure 3:
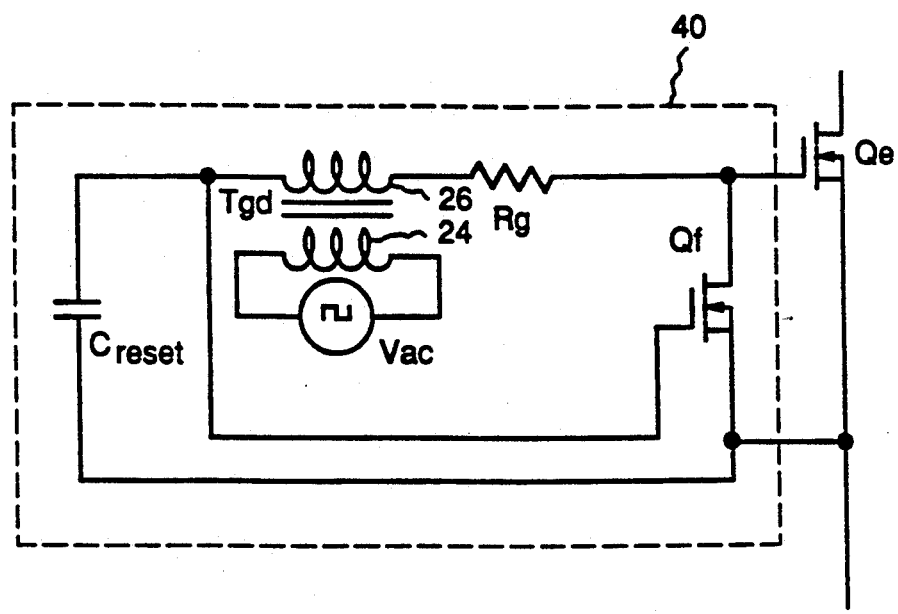
FIG. 3 schematically illustrates an alternative embodiment of the present invention wherein only one device is required to be driven.

FIG. 3 illustrates yet another embodiment of a gate driver circuit 40 according to the present invention wherein only one device Qe is required to be driven. In this embodiment, a storage, or reset, capacitor Creset is used to emulate the gate capacitance of a second device. However, the reset capacitor may be significantly smaller than the gate capacitance Ciss of a second device. As shown in FIG. 3, an auxiliary device Qf is employed (in similar manner to auxiliary devices Qc and Qd of FIG. 2) to actively insure that device Qe turns off completely, regardless of gate-drive transformer leakage inductance. In particular, assume device Qe is on. Upon polarity reversal of the square wave voltage, the gate capacitance of device Qe discharges to zero as the reset capacitance Creset charges to a positive polarity. As a result, device Qf is turned on, and actively holds device Qe to substantially zero voltage. Hence, device Qe is switched off completely.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A gate drive circuit for driving each of a pair of active switching devices at approximately 50% duty cycle and approximately 180° out-of-phase, each of said switching devices having a gate electrode and an associated gate capacitance, said gate drive circuit comprising:

a gate drive transformer having a secondary winding coupled between the gate electrodes of said active switching devices; and means for applying a square wave voltage to a primary winding of said gate drive transformer such that upon plurality reversal of said square wave voltage, the gate capacitance of an off-going switching device discharges from an on-voltage level to zero as the gate capacitance of an on-going switching device charges to said on-voltage level.

2. The gate driver circuit of claim 1, further comprising a damping resistance coupled in series with said secondary winding of said gate drive transformer.

3. The gate driver circuit of claim 1, further comprising a pair of auxiliary switching devices cross-coupled between the gates of each of said switching devices for ensuring that the respective gate capacitances discharge to zero voltage.

4. The gate driver circuit of claim 3 wherein a gate turn on threshold voltage of said auxiliary switching devices is controlled with respect to a gate turn-on threshold voltage of said switching devices in order to control dead time or conduction overlap of said switching devices.

5. A gate drive circuit for driving an active switching device at approximately 50% duty cycle, said switching device having a gate electrode, a source electrode and an associated gate capacitance therebetween, said gate drive circuit comprising:

a reset capacitance having a first terminal connected to said source electrode, and a second terminal;

a single gate drive transformer having a secondary winding with a first end coupled to the gate electrode of said active switching device, and a second end coupled to said reset capacitance second terminal; and means for applying a square wave voltage to a primary winding of said single gate drive transformer such that upon turn-off of said switching device by polarity reversal of said square wave voltage, said gate capacitance discharges from an on-voltage level to zero as said reset capacitance charges to said on-voltage level, and upon turn-on of said switching device by another polarity reversal of said square wave voltage, siad reset capacitance discharges from said on-voltage to zero as said gate capacitance charges to said on-voltage level.

6. The gate driver circuit of claim 5, further comprising a damping resistance coupled in series with said secondary winding of said gate drive transformer.

7. The gate driver circuit of claim 5, further comprising an auxiliary switching device connected directly between a source electrode and said gate electrode of said switching device for ensuring that said gate capacitance discharges to zero voltage upon turn-off thereof.

* * * * *